US011300930B2

(12) United States Patent
Grossenbacher et al.

(10) Patent No.: US 11,300,930 B2
(45) Date of Patent: Apr. 12, 2022

(54) PROCESS FOR THE PRODUCTION OF A TIMEPIECE PROVIDED WITH A HOLLOW OR RAISED EXTERNAL ELEMENT

(71) Applicant: The Swatch Group Research and Development Ltd, Marin (CH)

(72) Inventors: Pascal Grossenbacher, Neuchatel (CH); Stewes Bourban, Chabrey (CH); Pierry Vuille, Les Emibois (CH); Yves Winkler, Schmitten (CH)

(73) Assignee: The Swatch Group Research and Development Ltd, Marin (CH)

( * ) Notice: Subject to any disclaimer, the term of this patent is extended or adjusted under 35 U.S.C. 154(b) by 94 days.

(21) Appl. No.: 16/696,359

(22) Filed: Nov. 26, 2019

(65) Prior Publication Data

US 2020/0096946 A1 Mar. 26, 2020

Related U.S. Application Data

(62) Division of application No. 15/587,797, filed on May 5, 2017, now Pat. No. 10,528,008.

(30) Foreign Application Priority Data

May 19, 2016 (EP) .................................... 16170379

(51) Int. Cl.
*G03F 7/00* (2006.01)
*G04D 3/00* (2006.01)
(Continued)

(52) U.S. Cl.
CPC ......... *G04D 3/0048* (2013.01); *G04B 19/042* (2013.01); *G04B 19/10* (2013.01);
(Continued)

(58) Field of Classification Search
CPC .. G04D 3/0048; G04D 3/0069; G04D 3/0092; G04D 15/14; G04B 19/18;
(Continued)

(56) References Cited

U.S. PATENT DOCUMENTS

2005/0126917 A1* 6/2005 Morimoto ............ G04D 3/0092 205/50
2010/0054089 A1 3/2010 Maier et al.
(Continued)

FOREIGN PATENT DOCUMENTS

EP 2 543 625 A1 1/2013
FR 2 950 732 A1 4/2011

OTHER PUBLICATIONS

European Search Report dated Nov. 11, 2016 in European application 16170379.8 filed on May 19, 2016 (with English Translation of Categories Cited Documents).

*Primary Examiner* — Jun S Yoo
(74) *Attorney, Agent, or Firm* — Oblon, McClelland, Maier & Neustadt, L.L.P.

(57) ABSTRACT

A process for producing a part provided with an external element includes: providing an electrically conductive substrate having an upper surface and a raised pattern with a crest on the upper surface; depositing an electrically insulating layer onto the upper surface around the pattern to a thickness less than or equal to the distance between the crest and the upper surface; depositing a metal layer onto the crest by galvanic growth so that the metal layer partly rests on the insulating layer; dissolving the insulating layer; covering an assembly including the substrate and the metal layer with a mass of a base material of the part to form an imprint; separating the mass and the metal layer from the substrate, the mass then exhibiting an external element formed by a
(Continued)

recess, the shape of which corresponds to the imprint and the base of which interfaces with the metal layer.

14 Claims, 5 Drawing Sheets

(51) Int. Cl.

| | |
|---|---|
| ***G04B 19/18*** | (2006.01) |
| ***G04B 19/10*** | (2006.01) |
| ***G04B 19/12*** | (2006.01) |
| ***G04B 19/04*** | (2006.01) |
| ***G04B 45/00*** | (2006.01) |
| *A44C 27/00* | (2006.01) |

(52) U.S. Cl.
CPC ............. *G04B 19/12* (2013.01); *G04B 19/18* (2013.01); *G04B 45/00* (2013.01); *G04D 3/0069* (2013.01); *G04D 3/0092* (2013.01); *A44C 27/00* (2013.01)

(58) Field of Classification Search
CPC ...... G04B 19/10; G04B 19/12; G04B 19/042; G04B 45/00; G04B 37/22; G04B 13/02; G04B 31/06; G04B 29/027; B44C 1/14; C25D 1/10; C25D 3/48; C25D 3/46; C25D 5/022; C25D 1/003; C04B 41/90; A44C 27/00; G03F 7/0035; G03F 7/00; B81C 99/008
See application file for complete search history.

(56) References Cited

U.S. PATENT DOCUMENTS

2011/0203934 A1* 8/2011 Rey-Mermet .......... G04B 31/06 205/67
2011/0236580 A1* 9/2011 Winkler ................... B21J 1/006 427/282
2014/0177401 A1 6/2014 Grossenbacher et al.
2016/0170306 A1* 6/2016 Lima De Miranda ....................... A61L 31/022 606/167
2016/0176228 A1* 6/2016 Dubach ................... B44C 1/205 428/156

* cited by examiner

PROCESS FOR THE PRODUCTION OF A TIMEPIECE PROVIDED WITH A HOLLOW OR RAISED EXTERNAL ELEMENT

This application is a divisional of and claims priority to U.S. patent application Ser. No. 15/587,797, filed on May 5, 2017, which claims priority to EP No. 16170379.8, filed on May 19, 2016. The benefit of priority is claimed to each of the foregoing, and the entire contents of each of the foregoing are incorporated herein by reference.

FIELD OF THE INVENTION

The invention relates to a process for the production of a part such as a timepiece or item of jewellery, e.g. a watch dial, bezel, band or bracelet etc. More specifically, the process enables an external element such as an hour indicator, a decorative element etc. to be made on said part.

BACKGROUND OF THE INVENTION

In the field of clock-making or jewellery making it is classic practice to make raised external elements that are held non-detachably on their support. In particular, patent application EP 2192454A1 is known from the prior art, which describes a process for the production of an external element forming a relief on a dial. According to the third embodiment described in this application a watch dial having T-shaped through openings is made. A mask is then attached to the dial. The mask has openings arranged so as to connect with the openings of the dial. The openings are then filled by means of electroplating, by pressing an amorphous material or by metal injection in order to form external elements. Finally, the excess thickness of filling material of the mask is removed and the mask is taken off.

A disadvantage of this process is the restriction in the shape and depth of the openings causing a restriction in the shape and length of the external elements. For example, the process does not allow the formation of external elements that extend over only a portion of the dial. The external elements are possibly made from precious materials, e.g. gold, and it is therefore advantageous to restrict their depth in the dial that is not noticeable from the outside. Another disadvantage is that the process does not allow the production of external elements with heads that are textured, e.g. engraving. Another disadvantage is that the process does not allow the production of external elements that are formed from a non-metallic material. Another disadvantage is that the process does not allow the production of external elements that are not raised but are hollow, forming recesses of a desired shape, and in particular recesses with a coloured base.

SUMMARY OF THE INVENTION

The aim of the present invention is to fully or partly overcome the disadvantages discussed above.

For this purpose, according to a first embodiment the invention relates to a process for the production of a part provided with an external element, wherein the process comprises the following steps:

- provide an electrically conductive substrate having an upper surface and a raised pattern on said upper surface, wherein the pattern has an crest
- deposit an electrically insulating layer onto the upper surface of the substrate around the pattern to a thickness less than or equal to the distance between the crest and the upper surface
- deposit a metal layer onto the crest of the pattern by galvanic growth so that at the end of this step the metal layer partially rests on the insulating layer
- dissolve the insulating layer
- cover an assembly comprising the substrate and the metal layer with a mass of a base material of the part, wherein the mass forms an imprint of the assembly
- separate the mass and the metal layer from the substrate, wherein the mass then exhibits an external element formed by a recess, the shape of which corresponds to the imprint of the pattern and the base of which interfaces with the metal layer.

The process according to the first embodiment enables the production of a part provided with an external element forming a recess in the part. The geometry of the recess is determined by the geometry of the raised pattern present on the substrate: it is thus understood that the recess can have any desired shape. Moreover, the recess has a base with the colour of the metal layer, e.g. a golden base if the metal layer is made from gold. This metal layer forms an insert, from which the mass of base material cannot be separated without destroying the part. In fact, the invention benefits from a characteristic of the galvanic growth of a metal often considered as a fault, whereby the metal grows not only vertically from a surface arranged horizontally in a land reference point, but also laterally. This feature enables the metal layer to partially rest on the insulating layer at the end of the step of deposition by galvanic growth. The parts of the metal layer resting on the insulating layer, referred to as lateral ends in the following text, thus form hooks that are left sealed in the mass of base material of the part at the end of the covering step.

According to a second embodiment the invention relates to a process for the production of a part provided with an external element comprising the following steps:

- provide an electrically conductive substrate having an upper surface
- deposit an electrically insulating layer onto the upper surface of the substrate
- machine the insulating layer and the substrate so that a hollow pattern is formed that passes through the insulating layer and extends over a portion of the substrate
- deposit a metal layer into the pattern by galvanic growth so that at the end of this step the metal layer partially rests on the insulating layer
- dissolve the insulating layer
- cover an assembly comprising the substrate and the metal layer with a mass of a base material of the part, wherein the mass forms an imprint of the assembly
- separate the mass and the metal layer from the substrate, wherein the metal layer then forms an outgrowth forming an external element on the mass, the shape of the outgrowth corresponding to the imprint of the pattern.

The process according to the second embodiment allows a part provided with an external element forming an outgrowth to be produced. The outgrowth is formed by the part of the metal layer that projects from the mass of base material, the outgrowth thus being the colour of the metal layer. The geometry of the outgrowth is determined by the geometry of the hollow pattern machined onto the substrate. It is thus understood that the outgrowth can have any desired shape within the limit of machining possibilities of the substrate. Moreover, the metal layer forms an insert, which is impossible to separate from the mass of base material for the same reasons as those explained in relation to the first embodiment.

In addition, the production process according to the first or the second embodiment can comprise one or more of the following features in all technically possible combinations.

In a non-restrictive embodiment the process according to the first embodiment includes the following step:

machine the crest of the pattern so as to create a texture, e.g. an engraving.

In a non-restrictive embodiment the process according to the first or second embodiment includes the following step:

dissolve the metal layer, wherein the mass thus exhibits a cavity comprising anchoring arms formed by imprint of the metal layer.

In a non-restrictive embodiment the process according to the first or second embodiment includes the following step following the step of dissolving the metal layer:

fill the cavity with a compound such as a resin, a lacquer or a metal.

In a non-restrictive embodiment the process according to the first or second embodiment the base material of the mass is not metallic, wherein the compound is metallic, and the process includes the following step between the step of dissolving the metal layer and the step of filling the cavity with the compound:

deposit a metal film on the walls of the cavity by a physical vapour deposition process, and the filling step is conducted by galvanic growth of the compound on the metal film.

In a non-restrictive embodiment the process according to the first or second embodiment includes the following step:

insert a mineral, for example a diamond, into the cavity by means of a track opening into the cavity, wherein the mineral is then held in the cavity at the anchoring arms.

In a non-restrictive embodiment the process according to the first or second embodiment includes the following step performed before the step of depositing the insulating layer:

machine the upper surface of the substrate so as to create a texture, e.g. an engraving.

In a non-restrictive embodiment the process according to the first or second embodiment includes the following step performed after the step of depositing the metal layer:

machine the metal layer so as to reduce at least one of its dimensions and/or structure at least one of its surfaces.

In a non-restrictive embodiment the process according to the first or second embodiment the base material is a metal or an amorphous or partly amorphous metal alloy or a polymer, and the covering step is performed by pressing a block of base material onto the assembly comprising the substrate and the metal layer.

In a non-restrictive embodiment of the process according to the first or second embodiment the base material is metallic, and the covering step is performed by galvanic growth of the base material on the assembly comprising the substrate and the metal layer.

In a non-restrictive embodiment of the process according to the first or second embodiment the metal layer is formed from gold, silver, nickel or an alloy of the aforementioned metals.

In a non-restrictive embodiment of the process according to the first or second embodiment the insulating layer is formed from resin.

BRIEF DESCRIPTION OF THE DRAWINGS

Other special features and advantages will become clear from the following non-restrictive description provided as an example with reference to the attached drawings, wherein.

DETAILED DESCRIPTION OF THE PREFERRED EMBODIMENTS

According to a first embodiment illustrated in FIGS. 1*a* to 1*g* the process according to the invention comprises the following steps.

Figure 1A:
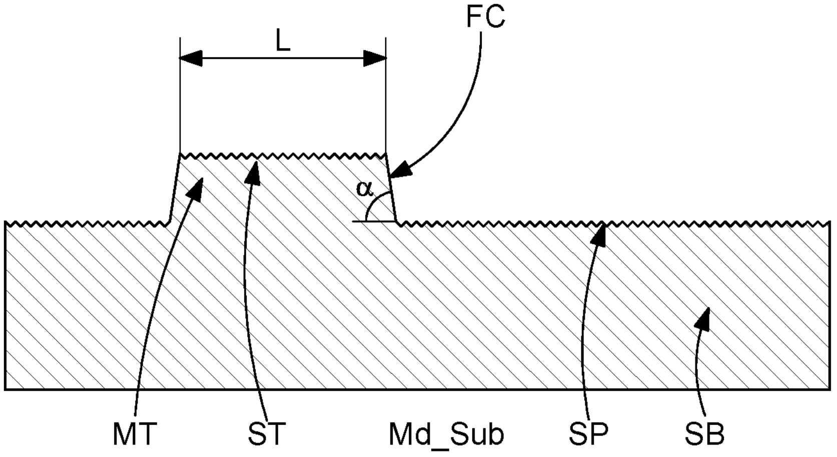
FIGS. 1*a* to 1*g* are schematic representations of steps of the process for the production of a part provided with an external element according to a first embodiment of the invention

According to a step Md_Sub shown in FIG. 1*a*, an electrically conductive substrate SB, also called a master in the field of moulding, is provided. The substrate SB is advantageously formed from brass, but can be formed from another material, e.g. stainless steel, aluminium, nickel, a cermet composite, a ceramic or a polymer that has been rendered conductive (by electroplating or plasma treatment, for example) etc. Moreover, the substrate SB has a pattern MT forming a relief or projection from an upper surface SP of the substrate SB. In one embodiment the pattern MT has been obtained by machining the substrate SB. In another embodiment the pattern has not been obtained by machining, but by injection or by hot-pressing a partially or totally amorphous metal alloy based on zirconium or platinum, for example.

In the example of FIG. 1*a* the pattern MT has a flat crest ST extending parallel to the upper surface SP of the substrate SB and flanks FC extending substantially orthogonally to said crest ST. This form is not restrictive; the flanks FC could be inclined in relation to the upper surface SP at an angle $\alpha$ less than 90°, the crest ST could be not completely parallel to the upper surface SP etc. It is noted that the upper surface SP and the crest ST have possibly undergone a surface machining operation to create a particular texture that is desired for the part, e.g. an engraving, as can be seen in FIG. 1*a*.

Figure 1B:
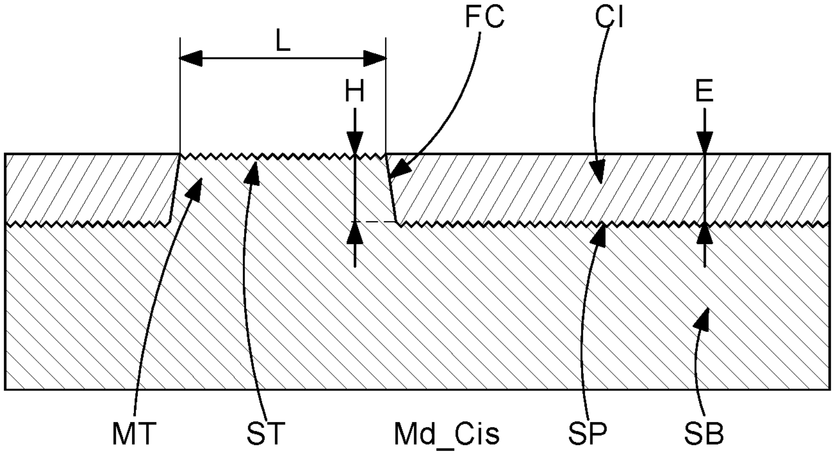

According to a step Md_Cis shown in FIG. 1*b* an insulating layer CI, advantageously a resin, is deposited onto the upper surface SP to a thickness E less than or equal to the height H of the pattern MT. The depositing step Md_Cis is performed, for example, by stoving a resin in viscous form deposited around the pattern MT. In practice, if the insulating layer CI is deposited to a thickness E that causes the insulating layer CI to extend beyond the crest ST of the pattern MT, the excess is removed by surface treatment. This surface treatment may also enable a texture to be created or recreated at the level of the crest SP.

Figure 1C:
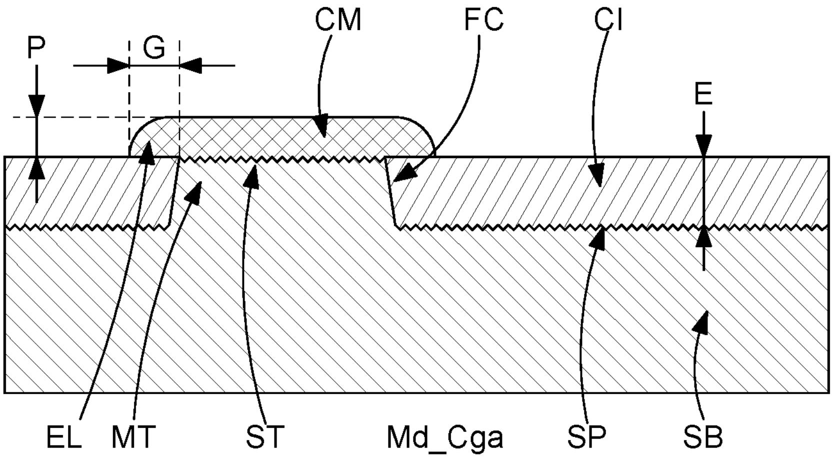

According to a step Md_Cga shown in FIG. 1*c* a metal layer CM is deposited onto the (electrically conductive) crest ST of the pattern MT by galvanic growth. The substrate SB topped by the insulating layer CI is thus dipped into a galvanic bath suitable for the deposition of a metal such as gold, silver, nickel or any other metal or metal alloy that can be deposited in a relatively thick layer. Because of the configuration of the insulating layer CI on the substrate SB, the metal deposit grows not only orthogonally to the crest ST, but also laterally, i.e. in the direction of the insulating layer CI. At the end of step Md_Cga the metal layer CM thus has lateral ends EL that rest on the insulating layer CI.

According to an optional step the metal layer CM is machined to reduce its thickness P and/or structure or polish its surface.

Figure 1D:
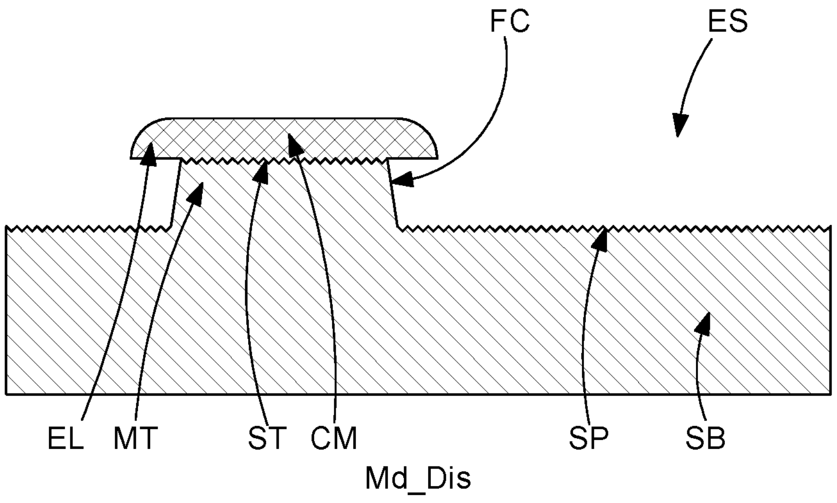

According to a step Md_Dis shown in FIG. 1*d* the insulating layer CI is dissolved. Thus, all that remains is an assembly ES formed from the substrate SB and the metal layer CM.

According to an optional step, a surface treatment of this assembly ES is conducted. This treatment is the application of a parting agent or a passivation treatment, for example. The significance of this step will be seen in the following text.

Figure 1E:
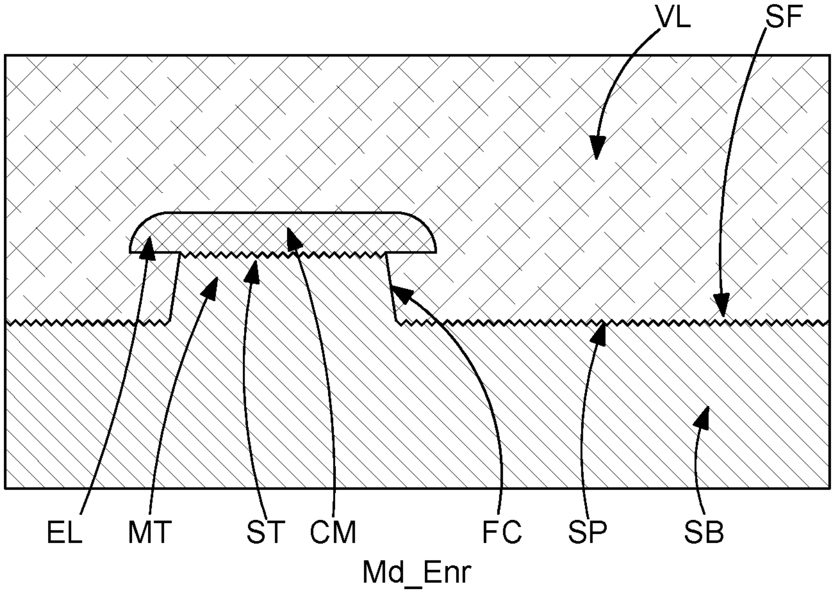

In a step Md_Enr shown in FIG. 1*e* this assembly ES is covered with a mass VL of a base material of the part to be produced so that the mass VL forms an imprint of the assembly ES. In one embodiment the base material consists of amorphous or partly amorphous metal, which is of interest because of its mechanical properties. In another embodiment the base material is a polymer. In these two cases a block of metal or of amorphous or partly amorphous metal alloy or polymer is pressed onto the assembly ES at a temperature, at which it has a paste-like consistency, which enables it to deform to mould to the shapes of the assembly ES, and in particular to the shapes of lateral ends EL of the metal layer CM. In another embodiment the base material is any other metal or metal alloy, e.g. nickel, gold etc., and the covering is conducted by galvanic growth of said metal. It is noted that at the end of step Md_Enr the metal layer CM is fixed to the mass VL of base material, since its lateral ends EL form hooks sealed into the mass VL of base material.

Figure 1F:
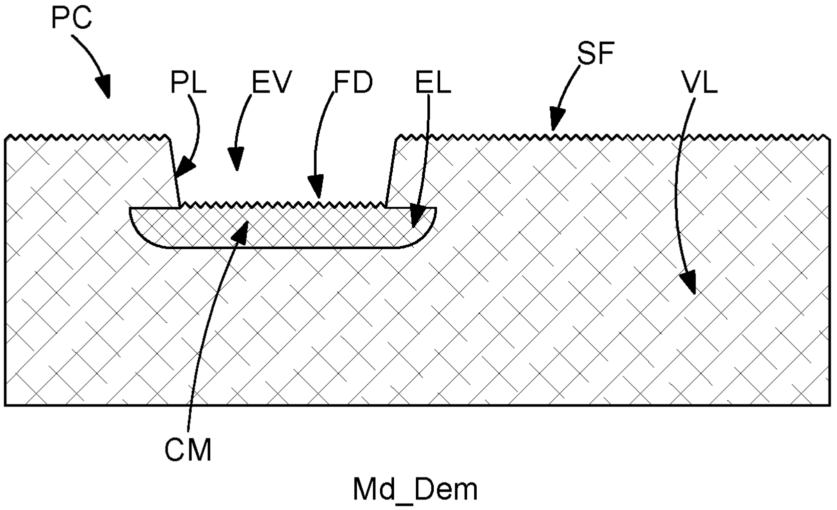

According to a step Md_Dem shown in FIG. 1*f* the mass VL of base material and the metal layer CM are separated from the substrate SB. To achieve this, the substrate SB is dipped into a selective acid bath, for example, in which it is dissolved. Alternatively, the separation is achieved by forcible demoulding. Demoulding is thus facilitated if the assembly ES has been surface treated beforehand.

At the end of step Md_Dem the mass VL of base material has a recess EV that corresponds in shape to the imprint of the pattern MT of the substrate SB, the base FD of which is the colour of the metal layer CM. It is noted that the transition between the mass VL of base material and the metal layer CM is clean. Moreover, as a result of imprints the mass VL has a textured appearance: the base FD of the recess EV has a mirror appearance similar to that of the crest ST of the substrate SB, and the surface SF of the mass VL that was previously facing the upper surface SP of the substrate SB has a mirror appearance similar to that of said upper surface SP.

Figure 1G:
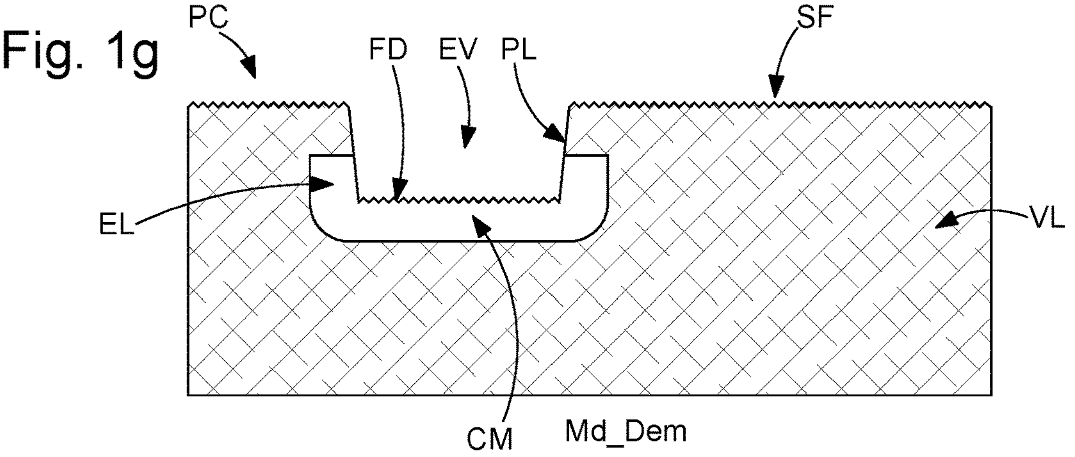

It is noted that FIG. 1*f* shows the substrate SB and the metal layer CM as they are when in step Md_Cis the insulating layer CI is deposited to a thickness E approximately equal to the height H of the pattern MT. The lateral ends EL of the metal layer CM then extend parallel to the base FD of the recess EV. In contrast, FIG. 1*g* shows the mass VL and the metal layer CM as they are when in step Md_Cis the insulating layer CI is deposited to a thickness E that is less than the height H of the pattern MT. The lateral ends EL of the metal layer CM then extend over a portion of the side walls PL of the recess EV.

The first embodiment thus allows production of a part PC provided with an enclosed external element. This external element is formed from a recess EV having a base FD with the colour of the metal layer CM, e.g. golden or silver. Moreover, the interface between the mass VL and the metal layer CM is clean without burrs. In addition, the metal layer CM is inseparable from the rest of the part. Finally, the surface SF of the part PC and the base FD of the recess EV are textured.

According to a second embodiment illustrated in FIGS. 2*a* to 2*f* the process according to the invention comprises the following steps.

According to one step a conductive substrate SB' is provided. The substrate SB' is advantageously made from brass, but can be made from another material, e.g. stainless steel, aluminium, nickel etc. The upper surface SP' of the substrate SB' may possibly have been subjected to a surface machining operation to create a particular texture that is desired for the part, e.g. an engraving, as is evident from FIG. 2*a*.

Figure 2A:
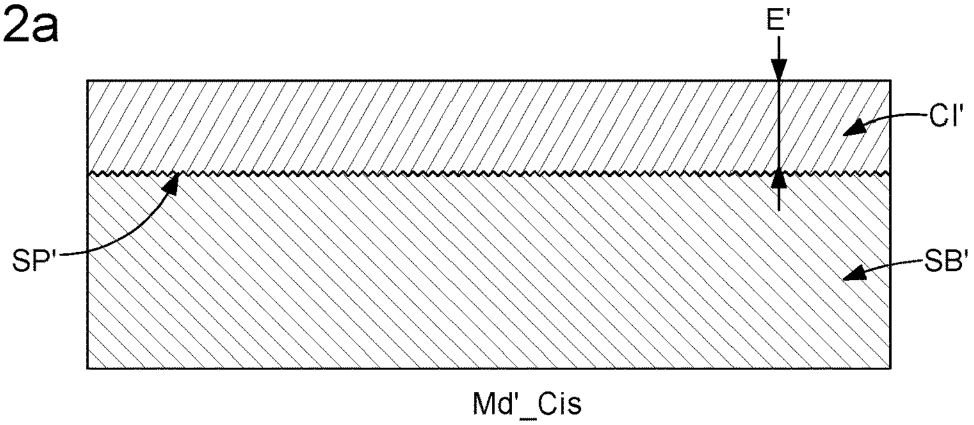
FIGS. 2*a* to 2*f* are schematic representations of steps of the process for the production of a part provided with an external element according to a second embodiment of the invention

According to a step Md'_Cis shown in FIG. 2*a* an insulating intermediate layer CI', advantageously a resin, with a thickness E' is deposited onto the upper surface SP' of the substrate SB'. The depositing step Md'_Cis is conducted, for example, by stoving a resin in viscous form deposited onto the upper surface SP'.

Figure 2B:
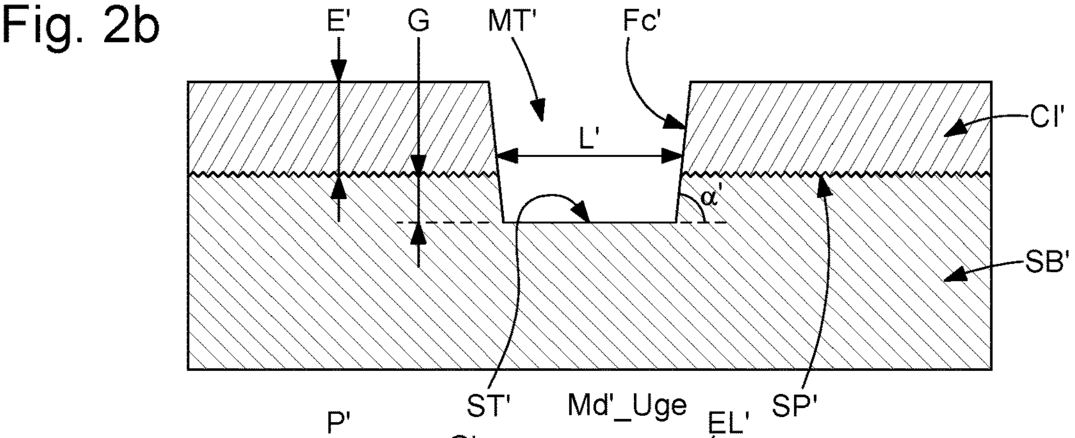

According to a step Md'_Uge shown in FIG. 2*b* the insulating layer CI' and the substrate SB' are machined in order to produce a hollow pattern MT' that extends through the insulating layer CI' and over a portion of the substrate SB' with thickness G. In the example of FIG. 2*b* the pattern MT' has a flat base ST', which extends parallel to the upper surface SP' of the substrate SB', and flanks FC', which extend approximately orthogonally to said base ST', but this form is not restrictive. The flanks FC' could be inclined in relation to the upper surface SP' at an angle α' less than 90°, the base ST' could be not completely parallel to the upper surface SP' etc.

Figure 2C:
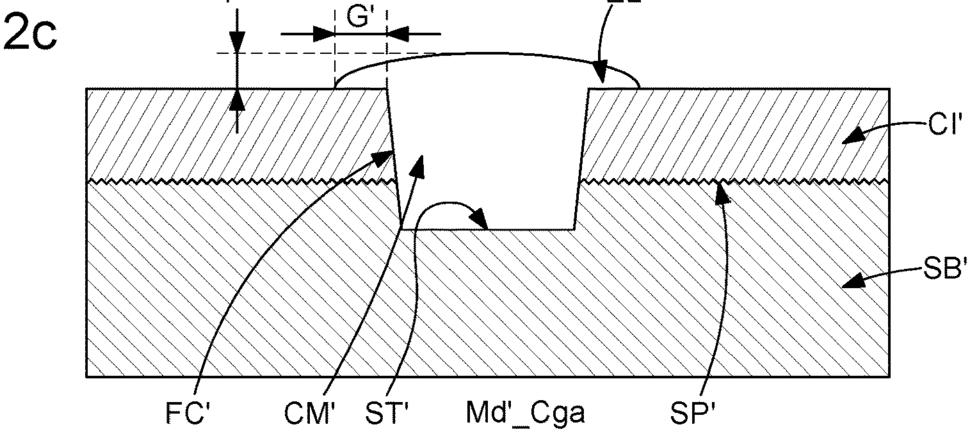

According to a step Md'_Cga shown in FIG. 2*c* a metal layer CM' is deposited into the pattern MT' by galvanic growth. The substrate SB' with the insulating layer CI' on top of it is thus dipped into a galvanic bath suitable for the deposition of a metal such as gold, silver, nickel or any other metal or metal alloy that can be deposited in a relatively thick layer. When the pattern MT' is completely filled with metal deposit, the metal deposit grows not only orthogonally to the base ST' of the pattern MT', but also laterally in order to be deposited on the insulating layer CI'. At the end of the step Md'_Cga the metal layer CM' thus has lateral ends EL', which rest on the insulating layer CI'.

According to an optional step the metal layer CM' is machined to reduce the thickness P' of the lateral ends EL' and/or structure or polish the surface of the metal layer CM'.

Figure 2D:
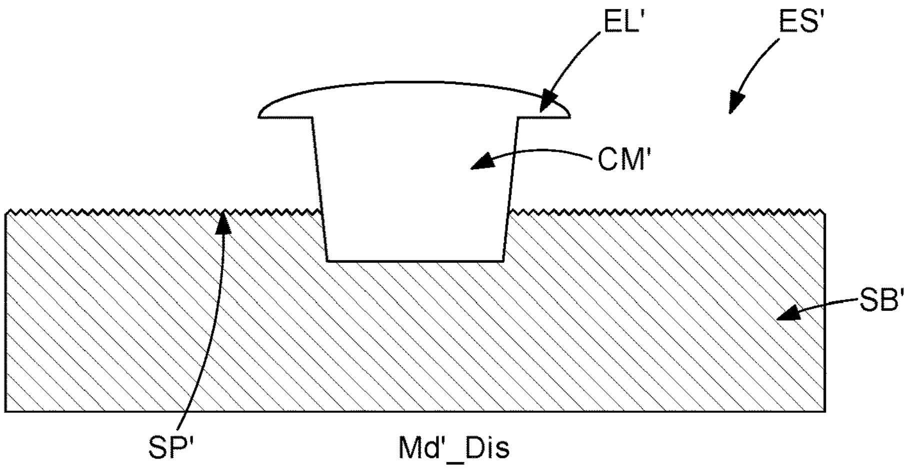

According to a step Md'_Dis shown in FIG. 2*d* the insulating layer CI' is dissolved. Thus, all that remains is an assembly ES' formed from the substrate SB' and the metal layer CM'.

According to an optional step a surface treatment of this assembly ES' is conducted. This treatment is the application of an oil or a passivation, for example. The significance of this step will be seen in the following text.

Figure 2E:
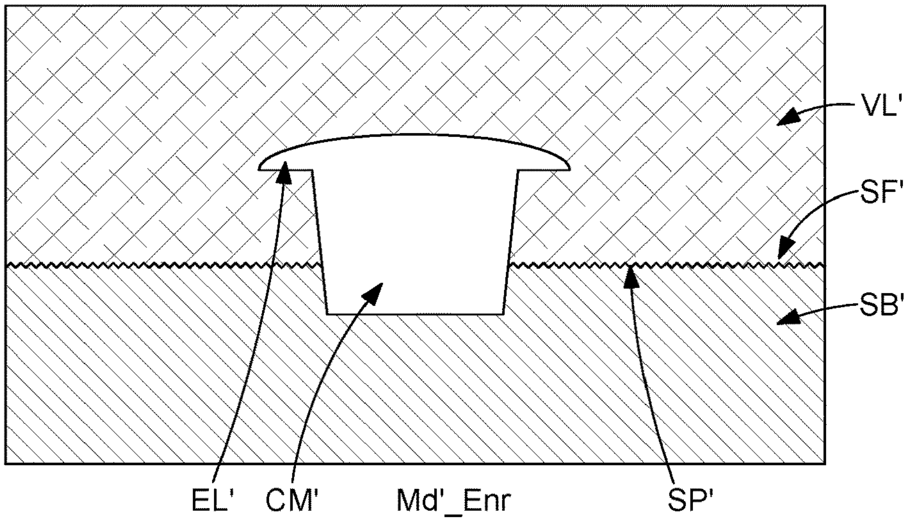

In a step Md'_Enr shown in FIG. 2*e* this assembly ES' is covered with a mass VL' of a base material of the part to be produced so that the mass VL forms an imprint of the assembly ES. In one embodiment the base material consists of metal or an amorphous or partly amorphous metal alloy. In another embodiment the base material is a polymer. In these two cases a block of amorphous or partly amorphous metal or polymer is pressed onto the assembly ES' at a temperature, at which it has a paste-like consistency, which enables it to deform to mould to the shapes of the assembly ES', and in particular the shapes of the lateral ends EL' of the metal layer CM'. In another embodiment the base material is any other metal, e.g. nickel, gold etc., and the covering is conducted by galvanic growth of said metal. It is noted that at the end of step Md'_Enr the metal layer CM' is fixed to the mass VL' of base material because its lateral ends EL' form hooks sealed into the mass VL' of base material.

Figure 2F:
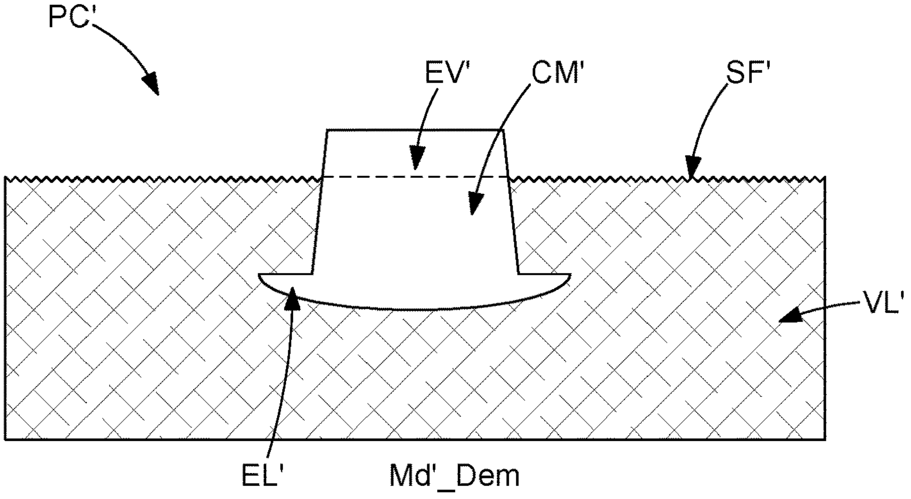

According to a step Md'_Dem shown in FIG. 2*f* the substrate SB', the mass VL' of base material and the metal layer CM' are separated. To achieve this, the substrate SB' is dipped into a selective acid bath, for example, in which it is dissolved. Alternatively, the separation is achieved by forcible demoulding. Demoulding is thus facilitated if the assembly ES' has been surface treated beforehand.

At the end of step Md'_Dem the metal layer CM' forms an outgrowth EV' on the mass VL' that corresponds in shape to the imprint of the pattern MT' in the substrate SB'. It is noted that the transition between mass VL' of base material and the metal layer CM' is clean. Moreover, as a result of imprints the mass VL' has a textured appearance: the surface SF' of the mass VL' that was previously facing the upper surface SP' of the substrate SB' has a mirror appearance similar to that of said upper surface SP'.

Thus, the second embodiment enables a part PC' provided with a raised external element to be produced. This external element consists of an outgrowth EV' formed by the metal layer CM'. Moreover, the interface between the mass VL' and the metal layer CM' is clean without burrs. In addition, the metal layer CM' is inseparable from the rest of the part. Finally, the surface SF' of the part PC can be textured.

Moreover, the process according to the first or the second embodiment possibly includes the following additional steps that enable the appearance of the external element to be modified.

Figure 3A:
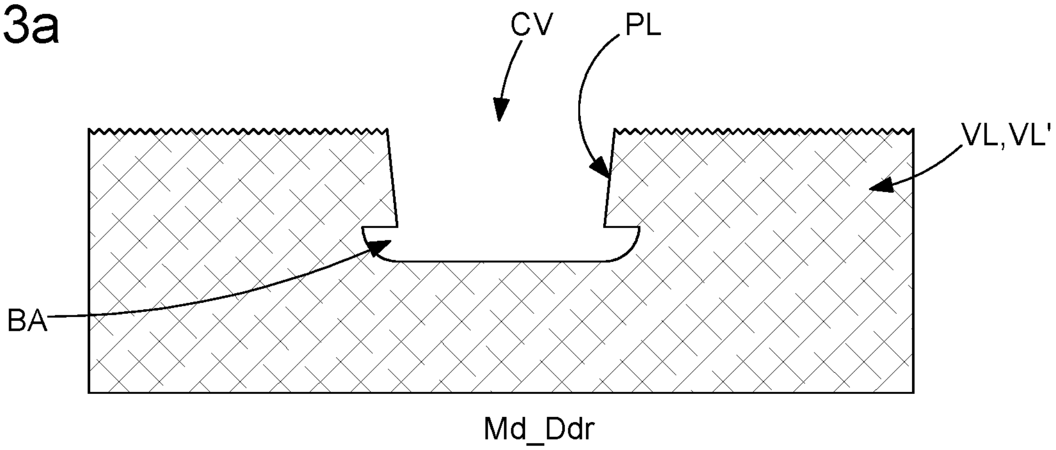
FIGS. 3*a* to 3*c* are schematic representations of additional steps of the process according to the first or the second embodiment.

According to an optional step Md_Ddr shown in FIG. 3*a* the metal layer CM, CM' is chemically dissolved. The mass VL, VL' then has a cavity CV comprising anchoring arms BA formed by imprint of the lateral ends EL, EL' of the metal layer CM, CM'. The geometry of the cavity CV depends on several parameters:

- the width L, L' of the pattern MT, MT' shown in FIGS. 1*a* and 2*b*
- the height H, E'+G of the pattern MT, MT' shown in FIGS. 1*b* and 2*b*
- the inclination α, α' of the flanks FC, FC' of the pattern MT, MT' shown in FIGS. 1*a* and 2*b*
- the width G, G' of the lateral ends EL, EL' of the metal layer CM, CM' shown in FIGS. 1*c* and 2*c*
- the thickness P, P' of said lateral ends EL, EL' of the metal layer CM, CM' (which is equal to their width G, G' unless the metal layer CM, CM' has been machined) shown in FIGS. 1*c* and 2*c*
- the thickness E, E' of the insulating layer CI, CI' deposited in step Md_Cis or Md'_Cis shown in FIGS. 1*b* and 2*b*.

The anchoring arms BA are advantageously used to hold an element such as a coloured resin, a fluorescent lacquer, a metal, a mineral etc. in place.

Figure 3B:
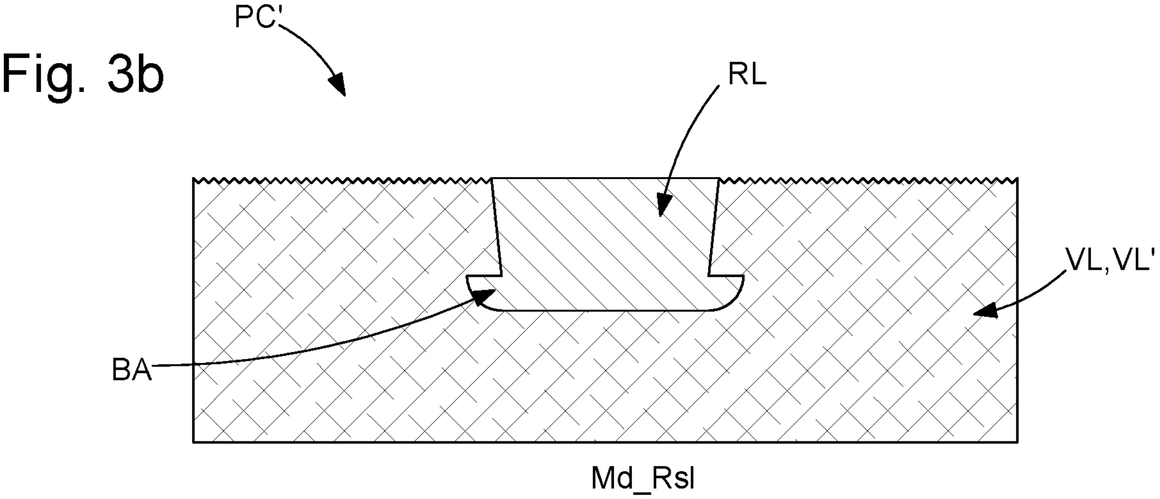

Hence, in an embodiment the process includes a step Md_Rsl, shown in FIG. 3*b*, for partially or completely filling the cavity CV with resin or lacquer RL, which may be coloured or fluorescent. The resin or lacquer RL is inserted, for example, in a paste-like form, then stoved to be solidified. Because of the anchoring arms BA it is then impossible to separate the resin or lacquer RL from the mass VL, VL'.

In an alternative embodiment the process includes a step of inserting a metal, a metal alloy or a composite into the cavity CV. The metal is inserted in liquid form, for example, then cooled to be solidified. Because of the anchoring arms it is then impossible to separate the metal from the mass VL, VL'. Alternatively, the metal can be deposited by galvanic growth. In this case, if the base material forming the mass VL, VL' is not metallic, it is necessary to perform a step of depositing at least one thin metal film into the cavity CV by physical vapour deposition beforehand.

Figure 3C:
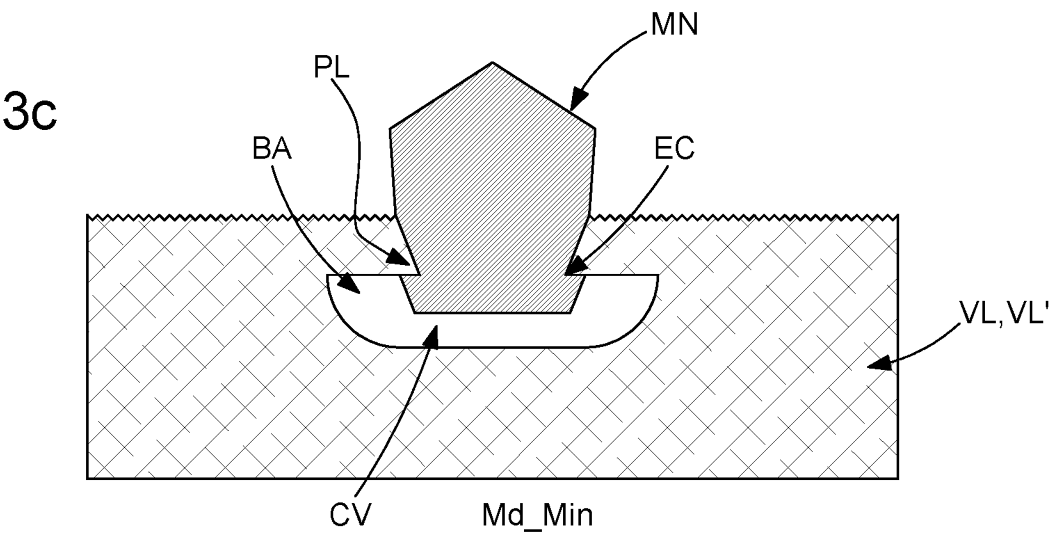

In an alternative embodiment the process includes a step Md_Min, shown in FIG. 3*c*, for setting a mineral MN, e.g. a diamond, in the cavity. The mineral MN then has a base with notches EC on top and said notches EC cooperate with a track leading to the cavity CV. When the mineral MN is in the cavity CV, it is held there by the anchoring arms BA. It is noted that in this case it is advantageous that the side walls PL of the cavity CV form a sharp angle with the anchoring arms BA, as can be seen in FIG. 3*c*, so that the side walls PL are fitted into the notches EC. This corresponds to a pattern MT, MT' in which the flanks FC, FC' have a low angle of inclination α, α'.

Of course, the present invention is not limited to the illustrated example, but is open to various variants and modifications that will occur to the person skilled in the art.

What is claimed is:

1. A process for producing a part provided with an external element, the process comprising:
- providing an electrically conductive substrate having an upper surface;
- depositing an electrically insulating layer onto the upper surface of the substrate;
- machining the insulating layer and the substrate so that a hollow pattern is formed that passes through the insulating layer and extends over a portion of the substrate;
- depositing a metal layer into the pattern by galvanic growth so that, at the end of the depositing the metal layer, the metal layer partly rests on the insulating layer;
- dissolve the insulating layer;
- covering an assembly comprising the substrate and the metal layer with a mass of a base material of the part, wherein the mass forms an imprint of the assembly;
- separating the mass and the metal layer from the substrate, wherein the metal layer then forms an outgrowth forming an external element on the mass, the shape of the outgrowth corresponding to an imprint of the pattern.

2. The production process according to claim 1, further comprising:
- dissolving the metal layer, wherein the mass then has a cavity comprising anchoring arms formed by an imprint of the metal layer.

3. The production process according to claim 2, further comprising, following the dissolving the metal layer:
- filling the cavity with a compound.

4. The production process according to claim 3, wherein the compound is a resin, a lacquer or a metal.

5. The production process according to claim 3, wherein the base material of the mass is not metallic, the compound is metallic, and the process includes, between the steps of the dissolving the metal layer and the filling the cavity with the compound:
- depositing a metal film on the walls of the cavity by a physical vapour deposition process, and
- wherein the filling is conducted by galvanic growth of the compound on the metal film.

6. The production process according to claim 2, further comprising:
- inserting a mineral, for example a diamond, into the cavity by means of a track opening into the cavity, wherein the mineral is then held in the cavity at the level of the anchoring arms.

7. The production process according to claim 6, wherein the mineral is a diamond.

8. The production process according to claim 1, further comprising, before the depositing the insulating layer:
  machining the upper surface of the substrate so as to create a texture.

9. The production process according to claim 8, where the texture is an engraving.

10. The production process according to claim 1, further comprising, after the depositing the metal layer:
  machining the metal layer so as to reduce at least one of its dimensions and/or structure at least one of its surfaces.

11. The production process according to claim 1, wherein the base material is a metal or an amorphous or partly amorphous metal alloy or a polymer, and the covering is performed by pressing a block of base material onto the assembly comprising the substrate and the metal layer.

12. The production process according to claim 1, wherein the base material is metallic and the covering is performed by galvanic growth of the base material on the assembly comprising the substrate and the metal layer.

13. The production process according to claim 1, wherein the metal layer is formed from gold, silver, nickel or an alloy of the aforementioned metals.

14. The production process according to claim 1, wherein the insulating layer is formed from resin.

* * * * *